(12) United States Patent
Lu et al.

(10) Patent No.: US 8,927,059 B2
(45) Date of Patent: Jan. 6, 2015

(54) DEPOSITION OF METAL FILMS USING ALANE-BASED PRECURSORS

(71) Applicant: Applied Materials, Inc., Santa Clara, CA (US)

(72) Inventors: Xinliang Lu, Fremont, CA (US); David Thompson, San Jose, CA (US); Jeffrey W. Anthis, San Jose, CA (US); Mei Chang, Saratoga, CA (US); Seshadri Ganguli, Sunnyvale, CA (US); Wei Tang, Santa Clara, CA (US); Srinivas Gandikota, Santa Clara, CA (US); Atif Noori, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 13/669,571

(22) Filed: Nov. 6, 2012

(65) Prior Publication Data

US 2013/0115383 A1 May 9, 2013

Related U.S. Application Data

(60) Provisional application No. 61/557,119, filed on Nov. 8, 2011, provisional application No. 61/614,922, filed on Mar. 23, 2012.

(51) Int. Cl.
| | | |
|---|---|---|
| C23C 16/06 | (2006.01) | |
| C23C 16/08 | (2006.01) | |
| C23C 16/10 | (2006.01) | |
| C23C 16/22 | (2006.01) | |
| C23C 16/455 | (2006.01) | |
| H01L 21/285 | (2006.01) | |
| H01L 21/768 | (2006.01) | |

(52) U.S. Cl.
CPC .............. *C23C 16/455* (2013.01); *C23C 16/06* (2013.01); *C23C 16/45525* (2013.01); *H01L 21/28562* (2013.01); *H01L 21/76841* (2013.01)
USPC ................. 427/250; 427/255.31; 427/255.39; 427/537

(58) Field of Classification Search
CPC ........ C23C 16/22; C23C 16/06; C23C 16/08; C23C 16/10; H01L 21/205
USPC ............ 427/248.1, 250, 255.23, 535, 255.31, 427/255.39, 537
See application file for complete search history.

(56) References Cited

U.S. PATENT DOCUMENTS

| | | | | |
|---|---|---|---|---|
| 6,458,701 B1 * | 10/2002 | Chae et al. | ..................... | 438/680 |
| 6,818,783 B2 * | 11/2004 | Norman et al. | ................ | 556/112 |
| 7,208,427 B2 * | 4/2007 | Roeder et al. | ................ | 438/791 |
| 2006/0205129 A1 * | 9/2006 | Sato et al. | ..................... | 438/197 |
| 2007/0045856 A1 * | 3/2007 | Vaartstra et al. | .............. | 257/771 |
| 2007/0071893 A1 * | 3/2007 | Lee et al. | ..................... | 427/248.1 |
| 2008/0003838 A1 * | 1/2008 | Haukka et al. | ................ | 438/765 |
| 2008/0057344 A1 * | 3/2008 | Murakami et al. | ............ | 428/698 |
| 2009/0087585 A1 * | 4/2009 | Lee et al. | ..................... | 427/576 |
| 2009/0203222 A1 | 8/2009 | Dussarrat et al. | | |
| 2009/0315093 A1 | 12/2009 | Li et al. | | |
| 2010/0209594 A1 * | 8/2010 | Curtis et al. | .................... | 427/74 |

FOREIGN PATENT DOCUMENTS

| | | |
|---|---|---|
| KR | 2001/0037839 | 5/2001 |
| KR | 2009/0018080 | 2/2009 |
| KR | 2010/0015073 | 2/2010 |

OTHER PUBLICATIONS

Kennedy, Alan R., et al., "N-Heterocyclic carbene stabilized adducts of alkyl magnesium amide, bisalkyl magnesium and Grignard reagents: trapping oligomeric organo s-block fragments with NHCs". Dalton Transactions, 2010, 39, 9091-9099.*
Alexander, Sean G., et al., "The synthesis of a dichlorosilane complex and its reaction with an a-diimine". Dalton Transactions, 2008, 6361-6363.*
Alexander, Sean G., et al., "Hydride-bromide exchange at an NHC—a new route to brominated alanes and gallanes". Dalton Transactions, 2009, 2909-2911.*
Schiefer, Marcus, et al., "Neutral and Ionic Aluminum, Gallium, and Indium Compounds Carrying Two or Three Terminal Ethynyl Groups". Inorganic Chemistry 2003, vol. 42, No. 16, 4970-4976.*
International Search Report of PCT/US2012/063870, mailed on Mar. 28, 2013, which corresponds to this current application.
Winter, Charles H., "The Chemical Vapor Deposition of Metal Nitride Films Using Modern Metalorganic Precursors", *Aldrichimica Acta*, vol. 33, No. 1, 2000, 11 pgs.

* cited by examiner

*Primary Examiner* — Bret Chen
(74) *Attorney, Agent, or Firm* — Servilla Whitney LLC

(57) ABSTRACT

Methods of depositing pure metal and aluminum alloy metal films. Certain methods comprises contacting a substrate surface with first and second precursors, the first precursor comprising an aluminum precursor selected from dimethylaluminum hydride, alane coordinated to an amine, and a compound having a structure represented by:

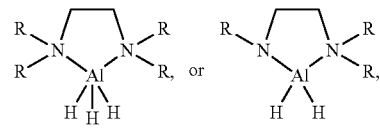

wherein R is a C1-C6 alkyl group, and the second precursor comprising a metal halide. Other methods relate to sequentially exposing a substrate to a first and second precursor, the first precursor comprising an aluminum precursor as described above, and the second precursor comprising $Ti(NR'_2)_4$ or $Ta(NR'_2)_5$, wherein R' is an alkyl, alkenyl, alkynyl, keto or aldehyde group.

19 Claims, 2 Drawing Sheets

DEPOSITION OF METAL FILMS USING ALANE-BASED PRECURSORS

CROSS REFERENCE PARAGRAPH

This application claims priority to U.S. Provisional Application Nos. 61/557,119, filed Nov. 8, 2011 and 61/614,922, filed Mar. 23, 2012, the contents of which are hereby incorporated by reference in their entirety.

TECHNICAL FIELD

Embodiments of the present invention generally relate to film deposition, and specifically to the deposition of films using metal halide and alane-based precursors.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures.

One method for deposition of thin films is atomic layer deposition (ALD). Most ALD processes are based on binary reaction sequences, where each of the two surface reactions occurs sequentially. Because the surface reactions are sequential, the two gas phase reactants are not in contact, and possible gas phase reactions that may form and deposit particles are limited. While ALD tends to result in more conformal films than traditional chemical vapor deposition (CVD), prior art processes for ALD have been most effective for deposition of metal oxide and metal nitride films. Although a few processes have been developed that are effective for deposition of elemental ruthenium and other late transition metals, in general ALD processes for deposition of pure metal have not been sufficiently successful to be adopted commercially.

In particular, pure metal films of Ti and Ta have many critical applications in the integrated circuit manufacturing process. Such applications include tungsten, aluminum and copper liners, as well as metal gate materials. However, many of these pure metals had to be deposited using plasma vapor deposition (PVD), plasma enhanced chemical vapor deposition (PECVD) or plasma enhanced atomic layer deposition (PEALD). These methods can be problematic with bad step coverage or damage to the substrate caused by the plasma. Thus, there is a need for new deposition chemistries and methods that are commercially viable without the disadvantages of previously used methods, particularly in the area of elemental metal films. The present invention addresses this problem by providing novel methods which are specifically designed and optimized to take avoid the problems associated with other methods.

SUMMARY

A first aspect of the invention relates to a method of depositing a film. The method comprising contacting a substrate surface with first and second precursors, the first precursor comprising an aluminum precursor selected from dimethylaluminum hydride, alane coordinated to an amine, and a compound having a structure represented by:

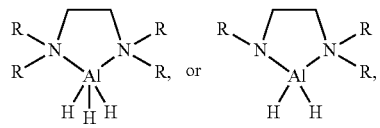

wherein R is a C1-C6 alkyl group, and the second precursor comprising a metal halide. In certain embodiments, R is methyl. In other embodiments, the alane coordinated to an amine comprises dimethylethylamine alane, triethylamine alane, trimethylamine alane or methylpyrrolidine alane. In one variant of this aspect, contacting the substrate surface with first and second precursors occurs sequentially. In another variant, contacting the substrate surface with first and second precursors occurs simultaneously or substantially simultaneously. In certain embodiments, the deposited film comprises a pure metal. As used herein, "pure metal" refers to a film that consists essentially of a given metal. In other certain embodiments, the deposited film comprises a metal alloy. The deposited films are suitable for use during an integrated circuit manufacturing process.

There are several different embodiments of metal halides that may be used. In one embodiment, the metal is selected from Ti, Ta, Zr, La, Ce, Si, Ge, W and Hf. In another embodiment, second precursor comprises a metal chloride, metal iodide or metal bromide. In a specific embodiment, the metal chloride is selected from $TiCl_4$ and $TaCl_5$.

In addition to different precursors, process conditions may be varied. For example, in one embodiment, an excess of amine is used. Temperature plays a role in whether alloy or pure metal is deposited. Thus, there are several different embodiments of temperatures that may be utilized. For example, in some embodiments, the temperature is lower than about 300° C. In other embodiments, deposition may take place at temperatures lower than about 100° C., and in others, even as low as about room temperature (about 23° C.). In one embodiment, deposition is carried out at a temperature range of about 50° C. to about 300° C., and in an even more specific embodiment, from about 50° C. to about 150° C. Where an aluminum alloy metal is desired, the process may be carried out at a temperature above about 300° C. However, in other embodiments, alloy deposition may take place at temperatures as low as about 150° C., 100° C., or 75° C.

In certain embodiments, film deposition may further comprise decreasing impurity in the film. In more specific embodiments, decreasing impurity in the film comprises annealing in hydrogen gas. In an alternative embodiment, decreasing impurity in the deposited film comprises plasma treatment.

A very particular embodiment of this aspect relates to a method of depositing a film. The method comprises sequentially contacting a substrate surface with first and second precursors, the first precursor comprising dimethylethylamine alane, triethylamine alane, trimethylamine alane or methylpyrrolidine alane, and the second precursor comprising $TiCl_4$ or $TaCl_5$.

Another aspect of the invention relates to a method of depositing a film, the method comprising exposing a substrate to a first and second precursor, the first precursor comprising an aluminum precursor selected from dimethylaluminum hydride, alane coordinated to an amine, and a compound having a structure represented by:

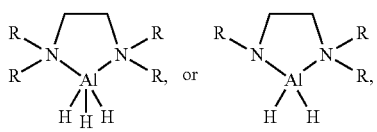

wherein R is a C1-C6 alkyl group, and the second precursor comprising Ti(NR'$_2$)$_4$ or Ta(NR'$_2$)$_5$, wherein R' is an alkyl, alkenyl, alkynyl, keto or aldehyde group. In certain embodiments, R is methyl. In specific embodiments, R' is C1-C4, and in very specific embodiments, a C1-C4 alkyl group. In a very specific embodiment, the second precursor comprises Ti(NMe$_2$)$_4$ or Ta(NMe$_2$)$_5$.

In various embodiments of this aspect, process conditions and precursors may differ. In one embodiment, the deposition is carried out at a temperature of about 50 to about 150° C. In another embodiment, an excess of amine is used. In a very particular embodiment, the molar ratio of amine to alane is more than about 99 to about 1. In other embodiments, the alane coordinated to an amine comprises dimethylethylamine alane, triethylamine alane, trimethylamine alane or methylpyrrolidine alane.

DETAILED DESCRIPTION

Figure 1A:
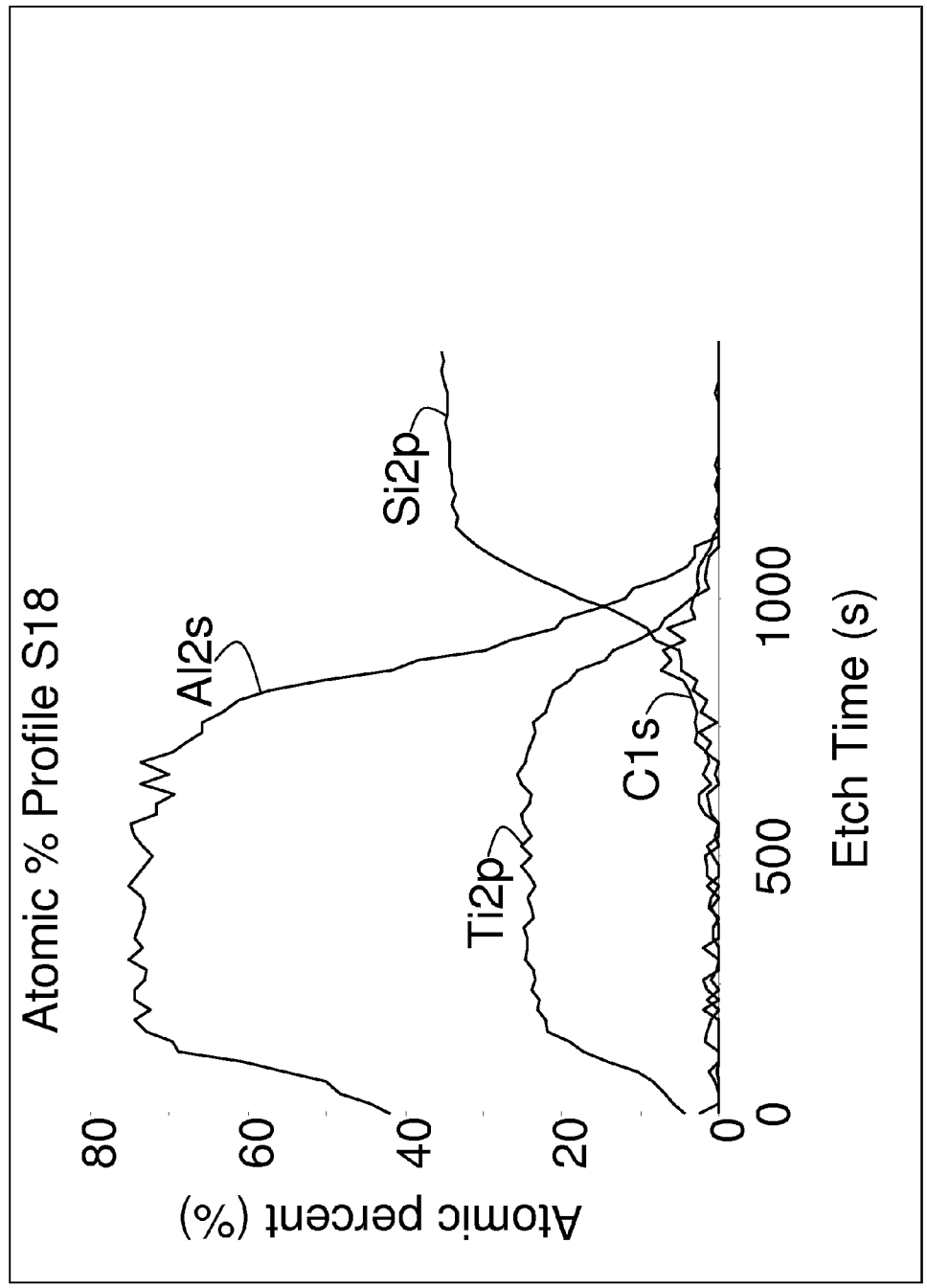
FIGS. 1A-B show an XPS compositional analysis of a film deposited according to one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

As used herein "pure metal film" refers to a film that substantially only contains one metal. In certain embodiments, such metal includes Ti, Ta, Zr, La, Hf or Ce. In certain embodiments, a pure metal film may also comprise impurities, particularly in an amount of less than 5% unwanted elements. In certain embodiments, the pure metal film may comprise some aluminum.

In accordance with various embodiments of the invention, provided are methods related to the deposition of pure metals and aluminum metal alloys. Accordingly, one aspect of the invention relates to a method of depositing a film, which comprises contacting a substrate surface with first and second precursors, the first precursor comprising an aluminum precursor and the second precursor comprising a metal halide. In one or more embodiments, the aluminum precursor may be selected from dimethylaluminum hydride, alane coordinated to an amine, and a compound having a structure represented by:

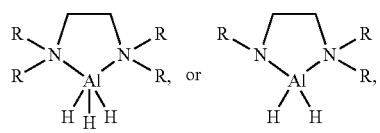

wherein R is a C1-C6 alkyl group, and the second precursor comprising a metal halide.

Various embodiments of the invention relate to the use of alane (aluminum hydride or AlH$_3$) precursors coordinated to an amine. Alane is an unstable compound, but can be stabilized by coordination to an amine. Such precursors may be represented by the formula AlH$_3$—NR$_3$. These precursors may be synthesized according to the following equation 1:

$$\text{LiAlH}_4 + \text{NR}_3 - \text{HCl} \rightarrow \text{AlH}_3 - \text{NR}_3 + \text{H}_2 + \text{LiCl} \quad \text{(Eq. 1)}$$

Examples of such amines include, but are not limited to, dimethylethylamine (DMA), triethylamine (TEA), trimethylamine (TMA) and N-methylpyrrolidine. The corresponding alane precursors would therefore be dimethylethylamine-alane (DMEAA), triethylamine-alane (TEAA), trimethylamine-alane (TMAA) and N-methylpyrrolidine-alane (NPA). Thus, in a specific embodiment, the alane coordinated to an amine comprises dimethylethylamine alane, triethylamine alane, trimethylamine alane or methylpyrrolidine alane.

In certain other embodiments, other aluminum precursors may be used. Such an aluminum precursor includes dimethylaluminum hydride (DMAH). Embodiments using such aluminum precursors may be used at higher temperatures.

In yet other embodiments, suitable aluminum precursors include those having a structure represented by:

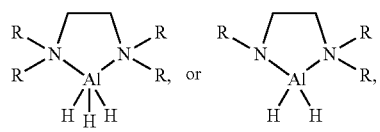

wherein R is any C1-C6 alkyl group. In specific embodiments, R is methyl.

According to various embodiments of the invention, metal halides are also used as a precursor. The metals may be selected according to the desired metal film. In one embodiment, the metal is selected from group 3, 4 and 5 transition metals. In a specific embodiment, the metal is selected from Ti, Ta, Zr, La, Hf Ce, Si, Ge and W. In a particular embodiment, the metals are Ti or Ta. In other embodiments, the halide is selected from Cl, I and Br, such that the second precursor comprises a metal chloride, metal iodide or metal bromide. Thus, several non-limiting examples of suitable metal halide precursors include TaCl$_5$, TaBr$_5$, TaI$_5$, TiCl$_4$, TiBr$_4$, TiI$_4$, LaCl$_3$, LaBr$_3$, LaI$_3$. In a particular embodiment, the metal halide precursor is TiCl$_4$ or TaCl$_5$. In other embodiments, group 14 metals are used, for example, Si and Ge.

Another aspect of the invention relates to a method of depositing a film, the method comprising exposing a substrate to a first and second precursor, the first precursor comprising alane coordinated to an amine, and the second precursor comprising Ti(NR'$_2$)$_4$ or Ta(NR'$_2$)$_5$, wherein R' is an alkyl, alkenyl, alkynyl, keto or aldehyde group. In one variant of this aspect, the substrate surface may be sequentially or substantially sequentially exposed to the first and second precursor. In another variant, the exposures may be simultaneous or substantially simultaneous. In particular embodiments, R' is C 1-C4, and in a very specific embodiment, a C1-C4 alkyl group. In particular embodiments, the second precursor comprises Ti(NMe$_2$)$_4$ or Ta(NMe$_2$)$_5$. One example of a method to obtain such precursors may be obtained by reacting TaCl$_5$ with LiNR$_2$ in the presence of a solvent to obtain Ta(NR'$_2$)$_5$, with a lithium chloride byproduct. The synthesis can be represented by the following equation 2:

$$TaCl_5 + 5LiNR_2 \rightarrow Ta(NR'_2)_5 + 5LiCl \qquad (eq.\ 2)$$

The process temperature is an important part of the process, and is one of the factors that are related to whether pure metal versus alloy is deposited. While not wishing to be bound to any particular theory, it is thought that the alane precursor reduces the metal halide to remove the halide, therefore leaving behind pure metal. At higher temperatures, the alane precursor will decompose, which may lead to incorporation of aluminum into the film. At lower temperatures, the alane precursor will not decompose and pure metal will be deposited. The specific temperature ranges for alloy versus pure metal deposition may vary with the alane precursor used. Thus, where pure metal is desired, the chamber or the substrate may be heated such that deposition can take place at a temperature lower than about 300° C. In other embodiments, deposition may take place at temperatures lower than about 100° C. In one embodiment, deposition is carried out at a temperature range of about 50° C. to about 300° C., and in an even more specific embodiment, from about 50° C. to about 150° C. Where an aluminum alloy metal is desired, the process may be carried out at a temperature above about 300° C. However, in other embodiments, alloy deposition may take place at temperatures as low as about 150° C., 100° C., or 75° C.

The amount of aluminum content in a deposited film can also be controlled by how much amine is used. In one embodiment, an excess of amine is utilized. An excess of amine refers to more than one molar equivalent to alane. In certain embodiments, the amine may be used as a carrier gas, which would correspond to a ratio of greater than 99:1. The use of excess amine used carry the alane can be used as a method of decreasing the aluminum concentration in the film. Excess amine can also enhance step coverage and increase deposition temperature. In some embodiments where the precursor comprises alane coordinated to an amine, the excess amine can be the amine to which the alane is coordinated. Thus, for example, where the alane precursor is DMEAA, excess DMEA can be utilized. Another suitable amine to be used in excess includes dimethylcyclohexyl (DMCA) amine.

In one embodiment, films are deposited using a chemical vapor deposition process. In such a process, the substrate may be exposed to both the alane precursor and the metal halide simultaneously, or substantially simultaneously.

In another embodiment, films are deposited using an atomic layer deposition (ALD) process. Therefore, in one embodiment, contacting the substrate surface with first and second precursors occurs sequentially or substantially sequentially. In a more specific embodiment, the method comprises metal halide exposure, followed by purge, followed by exposure to an alane coordinated to an amine, followed by another purge. In exemplary embodiment of an ALD process, a first chemical precursor ("A") is pulsed or flowed, for example, TiCl$_4$ or TaCl$_5$, to the substrate surface in a first half reaction. Excess reactants and the reaction by-products are removed, typically by an evacuation-pump down and/or by a flowing inert purge gas. Then a co-reactant or precursor "B", for example an alane coordinated to an amine, is delivered to the surface, wherein the precursors of the first half reaction are reacted with new ligands from the "B" co-reactant, creating an exchange by-product. The "B" co-reactant also forms self saturating bonds with the underlying reactive species to provide a saturating second half reaction. A second purge period is typically utilized to remove unused reactants and the reaction by-products. The "A" precursor, "B" co-reactants and purge gases can then again be flowed. The alternating exposure of the surface to reactants "A" and "B" is continued until the desired thickness film is reached, which for most anticipated applications would be approximately in the range of 5 nm to 40 nm, and more specifically in the range of 10 and 30 nm (100 Angstroms to 300 Angstroms). It will be understood that the "A", "B", and purge gases can flow simultaneously, and the substrate and/or gas flow nozzle can oscillate such that the substrate is sequentially exposed to the A, purge, and B gases as desired.

The precursors and/or reactants may be in a state of gas or vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

Thus, in one or more embodiments, alternating pulses or flows of "A" reactant and "B" reactant can be used to deposit a film, for example, in a pulsed delivery of multiple cycles of pulsed precursors and co-reactants, for example, A pulse, B pulse, A pulse, B pulse, A pulse, B pulse, A pulse, B pulse. As noted above, instead of pulsing the reactants, the gases can flow simultaneously from a gas delivery head or nozzle and the substrate and/or gas delivery head can be moved such that the substrate is sequentially exposed to the gases.

Of course, the aforementioned ALD cycles are merely exemplary of a wide variety of ALD process cycles in which a deposited layer is formed by alternating layers of precursors and/or co-reactants.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming films, a processing chamber is configured to expose the substrate to a sequence of gases and/or plasmas during the vapor deposition process. The processing chamber would include separate supplies of the A and B reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform an ALD process as described herein. The central processing unit may be one of any forms of a computer processor that can be used in an industrial setting for controlling various chambers and subprocessors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In one or more embodiments, the various gases for the process may be pulsed into an inlet, through a gas channel, from various holes or outlets, and into a central channel. In one or more embodiments, the deposition gases may be sequentially or substantially sequentially pulsed to and through a showerhead. Alternatively, as described above, the gases can flow simultaneously or substantially simultaneously through gas supply nozzle or head and the substrate and/or the gas supply head can be moved so that the substrate is sequentially or substantially sequentially exposed to the gases.

In some embodiments of the method described above, the substrate surface is contacted with DMAH and $TiCl_4$. In further embodiments, excess amine is used. In one or more embodiments, the substrate surface is contacted with alane amine and $TiCl_4$.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of a metal halide or $Ti(NR'_2)_4$ or $Ta(NR'_2)_5$, wherein R' is an alkyl, alkenyl, alkynyl, keto or aldehyde group, precursor. The apparatus also includes a reactant gas inlet in fluid communication with a supply of a precursor comprising an alane coordinated to an amine, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785.

The ALD process provides that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr.

Delivery of "A" Precursor to Substrate Surface

The substrate can be exposed to the "A" precursor gas or vapor formed by passing a carrier gas (for example, nitrogen or argon) through an ampoule of the precursor, which may be in liquid form. The ampoule may be heated. The "A" precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing "A" precursor gas for a time period within a range from about 0.1 seconds to about 10 seconds, for example, from about 1 second to about 5 seconds, and in a specific example, for approximately 2 seconds. The flow of the "A" precursor gas is stopped once the precursor has adsorbed onto all reactive surface moieties on the substrate surface. In some embodiments, the surface is readily saturated with the reactive precursor "A" such that additional exposure would not result in additional deposition.

First Purge

The substrate and chamber may be exposed to a purge step after stopping the flow of the "A" precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

Delivery of "B" precursor to Substrate Surface

After the first purge, the substrate active sites can be exposed a "B" precursor gas or vapor formed by passing a carrier gas (for example, nitrogen or argon) through an ampoule the "B" reactant. The ampoule may be heated. The "B" reactant gas can be delivered at any suitable flow rate within a range from about 10 sccm to about 2,000 sccm, for example, from about 50 sccm to about 1,000 sccm, and in specific embodiments, at about 200 sccm. The substrate may be exposed to the "B" reactant gas for a time period within a range from about 0.1 seconds to about 8 seconds, for example, from about 1 second to about 5 seconds, and in a specific example, for about 2 seconds. The flow of the "B" reactant gas may be stopped once "B" has adsorbed onto and reacted with readily "A" precursor deposited in the preceding step.

Second Purge

The substrate and chamber may be exposed to a purge step after stopping the flow of the "B" co-reactant gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. The "B" precursor gas may also be in the form of a plasma generated remotely from the process chamber.

Accordingly, one very particular embodiment of the invention relates to a method of depositing a Ta or Ti film. The method comprises sequentially contacting a substrate surface with first and second precursors, the first precursor comprising dimethylethylamine alane, triethylamine alane, trimethylamine alane or methylpyrrolidine alane, and the second precursor comprising $TiCl_4$ or $TaCl_5$.

In certain embodiments, the deposited film may also be given a post-treatment process. Such a process includes decreasing any impurities in the film. In certain specific embodiments, the treatment may be done in-situ, that is, without a vacuum break. In even more specific embodiments, decreasing the impurity in the film comprises annealing in hydrogen gas or by exposing the film to a plasma treatment.

The films deposited according to one or more embodiments of the invention may be used in the integrated circuit manufacturing process. For example, films comprising pure titanium or tantalum may be used as tungsten, aluminum or copper liners. In other embodiments, the films may be used as metal gate materials. In contrast to previously known methods of depositing such films, which often used plasma-based methods, the films according to various embodiments of the invention provide good step coverage without the damaging effects of plasma use.

EXAMPLES

Example 1

A film was produced using $TiCl_4$ and dimethylethylamine alane. The process involved exposure of the substrate surface to $TiCl_4$, followed by a first purge, exposure to dimethylethylamine alane, followed by another purge. The deposition temperature was in the range of about 50 to about 150° C. The exposure times ranged from between about 1 second to about 30 seconds. X-ray photoelectron spectroscopy was used to determine the elemental composition of the film, the graph of which can be seen in FIGS. 1A-B. The elemental composition was determined to be as shown in Table 1 below.

TABLE 1

Average Concentration (atomic %) in bulk TiAl Film

Average concentration (at. %) in bulk TiAl film:

| Al2s | C1s | Cl2p | N1s | O1s | Si2p | Ta4f | Ti2p | Ti/Al |
|------|-----|------|-----|-----|------|------|------|-------|
| 73.6 | 0.9 | 0.2  | 0.2 | 0.1 | 0.7  | 0.0  | 24.4 | 0.33  |

Figure 1B:
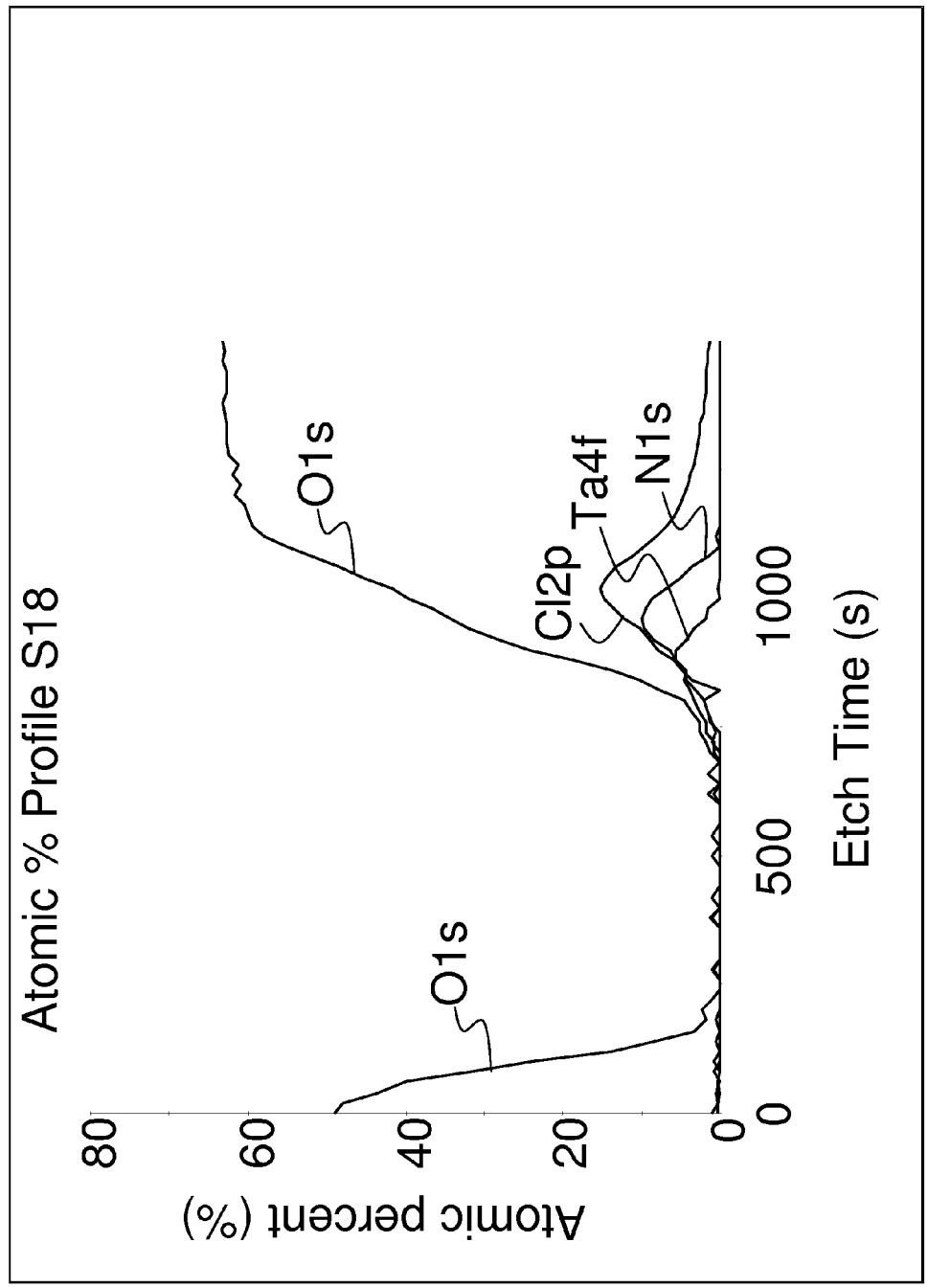

As can be seen in Table 1 and FIGS. 1A-B, the film notably contains very little carbon, chlorine or nitrogen. This is a surprising result, as most ALD films result in the deposition of films with carbon and/or nitrogen. Although not wishing to be bound to any particular theory, it is thought that the alane helps to reduce chlorine out of the film to deposit aluminum.

Example C1

A TiAl film was deposited using standard PVD techniques. This film is considered comparative because it was deposited using PVD and not the ALD techniques described herein. Table 2 below compares the properties of the film from Example 1 and C1.

TABLE 2

Comparison With PVD

| Film | Resistivity (mW-cm for 100 A) | Density (g/cc) | C-Content (%) | WF (eV) |
|------|-------------------------------|----------------|---------------|---------|
| RF-PVD TiAl | 220 | 3.58 | 0 | 4.15 |
| TiAl | 210 | 3.70 | 0.9% | 4.15 |

As seen in Table 2, the two films exhibit similar properties with respect to resistivity, density, carbon content and work function. However, PVD films are well-known to deposit films that are relatively non-conformal, particularly for certain applications. Such applications include use as work function metals in FinFET devices. In contrast, the films deposited by the methods described herein provide relatively conformal films, which are suitable for such applications.

Example 2

Four more films were produced using the method from Example 1. The molar ratios of the precursors were varied to obtain varying Ti/Al ratios in the deposited film. The films are shown below in Table 3.

TABLE 3

Film Tuning

| Ti/Al Ratio | Resistivity (mW-cm) | Thickness (A) |
|-------------|---------------------|---------------|
| 0.30 | 64  | 249 |
| 0.33 | 71  | 210 |
| 0.40 | 130 | 227 |
| 0.44 | 198 | 219 |
| 0.53 | 230 | 183 |

As shown in Table 3, the films deposited by the methods described herein can be changed to control the metal/aluminum ratio. Thus, the resistivity of the films (as well as work function values) can be varied with changes in the Ti/Al ratios. It should be noted that although there may be some correlation between resistivity and thickness of the film, the thicknesses provided in Table 3 are generally comparable.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a metal or metal alloy film, the method comprising contacting a substrate surface with first and second precursors, the first precursor comprising an aluminum precursor selected from dimethylaluminum hydride, alane coordinated to an amine, and a compound having a structure represented by:

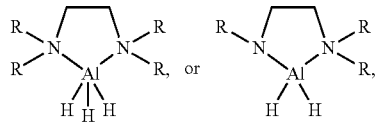

wherein R is a C1-C6 alkyl group, and the second precursor comprising a metal halide, wherein the film deposited is a metal or metal alloy film with less than about 0.2 atomic % nitrogen.

2. The method of claim 1, wherein the first precursor comprises a compound having a structure represented by

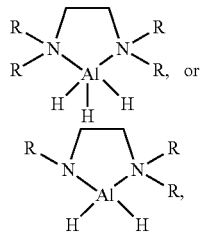

wherein R is methyl.

3. The method of claim 1, wherein the alane coordinated to an amine comprises dimethylethylamine alane, triethylamine alane, trimethylamine alane or methylpyrrolidine alane.

4. The method of claim 1, wherein contacting the substrate surface with the first and second precursors occurs sequentially.

5. The method of claim 1, wherein the metal is selected from Ti, Ta, Zr, La, Ce, Si, Ge, W and Hf.

6. The method of claim 1, wherein the second precursor comprises a metal chloride, metal iodide or metal bromide.

7. The method of claim 6, wherein the metal chloride is selected from $TiCl_4$ and $TaCl_5$.

8. The method of claim 1, wherein an excess of amine is used.

9. The method of claim 8, wherein the first precursor comprises dimethylaluminum hydride and the second precursor comprises $TiCl_4$.

10. The method of claim 1, wherein deposition is carried out at a temperature of about 23° C. to about 300° C.

11. The method of claim 1, wherein the deposited film comprises a pure metal.

12. The method of claim 1, wherein the deposited film comprises a metal alloy.

13. The method of claim 1, further comprising annealing in hydrogen gas or plasma treatment.

14. A method of depositing a film, the method comprising exposing a substrate to a first and second precursor, the first precursor comprising a compound having a structure represented by:

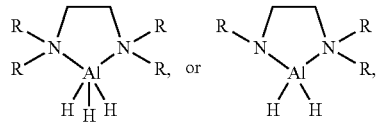

wherein R is a C1-C6 alkyl group, and the second precursor comprising $Ti(NR'_2)_4$ or $Ta(NR'_2)_5$, wherein R' is a C1-C4 alkyl, alkenyl, alkynyl, keto or aldehyde group.

15. The method of claim 14, wherein R is methyl.

16. The method of claim 14, wherein the second precursor comprises $Ti(NMe_2)_4$ or $Ta(NMe_2)_5$.

17. The method of claim 14, wherein deposition is carried out at a temperature of about 50 to about 150° C.

18. The method of claim 14, wherein an excess of amine is used.

19. A method of depositing a film, the method comprising sequentially contacting a substrate surface with first and second precursors, the first precursor comprising dimethylethylamine alane, triethylamine alane, trimethylamine alane or methylpyrrolidine alane, and the second precursor comprising $TiCl_4$ or $TaCl_5$, wherein the deposited film has a nitrogen content less than about 0.2 atomic percent.

* * * * *